(12) United States Patent
Starkston et al.

(10) Patent No.: US 11,444,033 B2
(45) Date of Patent: Sep. 13, 2022

(54) HYBRID MICROELECTRONIC SUBSTRATE AND METHODS FOR FABRICATING THE SAME

(71) Applicant: Intel Corporation, Santa Clara, CA (US)

(72) Inventors: Robert Starkston, Phoenix, AZ (US); Robert L. Sankman, Phoenix, AZ (US); Scott M. Mokler, Hillsboro, OR (US); Richard C. Stamey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 16/918,900

(22) Filed: Jul. 1, 2020

(65) Prior Publication Data
US 2020/0335444 A1    Oct. 22, 2020

Related U.S. Application Data

(62) Division of application No. 15/774,221, filed as application No. PCT/US2015/064722 on Dec. 9, 2015, now Pat. No. 10,763,215.

(51) Int. Cl.
*H01L 23/538* (2006.01)
*H01L 21/683* (2006.01)
(Continued)

(52) U.S. Cl.
CPC ........ *H01L 23/5385* (2013.01); *H01L 21/486* (2013.01); *H01L 21/6835* (2013.01);
(Continued)

(58) Field of Classification Search
CPC ............ H01L 23/5383–5389; H01L 24/18–25
See application file for complete search history.

(56) References Cited

U.S. PATENT DOCUMENTS 7,030,494 B2    4/2006  Aoki
7,294,529 B2   11/2007  Tuominen
(Continued)

FOREIGN PATENT DOCUMENTS

CN    102037797    4/2011
CN    102045964    5/2011
(Continued)

OTHER PUBLICATIONS

Notice of Allowance for Taiwan Patent Application No. 105134427, dated Dec. 1, 2020.
(Continued)

*Primary Examiner* — Stephen M Bradley
(74) *Attorney, Agent, or Firm* — Essential Patents Group, LLP.

(57) ABSTRACT

A hybrid microelectronic substrate may be formed by the incorporation of a high density microelectronic patch substrate within a lower density microelectronic substrate. The hybrid microelectronic substrate may allow for direct flip chip attachment of a microelectronic device having high density interconnections to the high density microelectronic patch substrate portion of the hybrid microelectronic substrate, while allowing for lower density interconnection and electrical routes in areas where high density interconnections are not required.

19 Claims, 9 Drawing Sheets

(51) Int. Cl.
  *H01L 21/48* (2006.01)
  *H01L 23/498* (2006.01)
  *H01L 25/065* (2006.01)

(52) U.S. Cl.
  CPC .. *H01L 23/49833* (2013.01); *H01L 23/49894* (2013.01); *H01L 23/5383* (2013.01); *H01L 23/5384* (2013.01); *H01L 23/5386* (2013.01); *H01L 23/5389* (2013.01); *H01L 23/49822* (2013.01); *H01L 23/49827* (2013.01); *H01L 25/0655* (2013.01); *H01L 2221/68345* (2013.01)

(56) References Cited

U.S. PATENT DOCUMENTS

| | | | |
|---|---|---|---|
| 7,842,541 | B1 | 11/2010 | Rusli et al. |
| 7,935,893 | B2 | 5/2011 | Tanaka et al. |
| 8,177,577 | B2 * | 5/2012 | Takahashi ............... H05K 1/142 439/392 |
| 8,866,287 | B2 | 10/2014 | Teh et al. |
| 9,159,693 | B2 | 10/2015 | Choi |
| 2003/0170434 | A1 | 9/2003 | Suzuki et al. |
| 2004/0262716 | A1 | 12/2004 | Aoki |
| 2005/0253244 | A1 * | 11/2005 | Chang .................... H01L 24/19 257/E23.179 |
| 2009/0290318 | A1 | 11/2009 | Takahashi |
| 2011/0228464 | A1 | 9/2011 | Guzek et al. |
| 2012/0049366 | A1 | 3/2012 | Zeng |
| 2013/0284572 | A1 | 10/2013 | Teh et al. |
| 2014/0021635 | A1 | 1/2014 | Goh et al. |
| 2014/0091442 | A1 | 4/2014 | Cheah et al. |
| 2014/0091474 | A1 | 4/2014 | Starkston et al. |
| 2014/0093999 | A1 | 4/2014 | Teh et al. |
| 2014/0118976 | A1 | 5/2014 | Yoshikawa et al. |
| 2014/0159228 | A1 | 6/2014 | Teh et al. |
| 2014/0175672 | A1 | 6/2014 | Choi |
| 2014/0291001 | A1 | 10/2014 | Lin et al. |
| 2018/0211929 | A1 * | 7/2018 | Bae ......................... H01L 24/17 |
| 2018/0352658 | A1 | 12/2018 | Yang |
| 2019/0057915 | A1 | 2/2019 | Starkston et al. |
| 2019/0057937 | A1 | 2/2019 | Starkston et al. |

FOREIGN PATENT DOCUMENTS

| | | |
|---|---|---|
| JP | 11317582 | 11/1999 |
| KR | 10-0648971 | 11/2006 |
| KR | 10-0769527 | 10/2007 |
| KR | 10-1023372 | 3/2011 |

OTHER PUBLICATIONS

Office Action for Chinese Patent Application No. 201580085212.7, dated Jun. 17, 2021.
Search Report for Taiwan Patent Application No. 105134427, dated Jul. 8, 2020.
Fiinal Office Action for U.S. Appl. No. 15/774,221, notified Sep. 26, 2019.
Final Office Action for U.S. Appl. No. 15/771,774, notified Nov. 12, 2019.
International Preliminary Report on Patentability for International Patent Application No. PCT/US15/63761, dated Jun. 14, 2018.
International Preliminary Report on Patentability for International Patent Application No. PCT/US15/64722, dated Jun. 21, 2018.
International Search Report and Written Opinion for International Patent Application No. PCT/US15/63761, dated Aug. 24, 2016.
International Search Report and Written Opinion for International Patent Application No. PCT/US15/64722, dated Aug. 18, 2016.
Non-Final Office Action for U.S. Appl. No. 15/774,221, notified Jan. 23, 2020.
Notice of Allowance for U.S. Appl. No. 15/774,221, dated Apr. 30, 2020.
Notice of Allowance for U.S. Appl. No. 15/771,774, dated Mar. 18, 2020.
Office Action for U.S. Appl. No. 15/771,774, notified Jun. 21, 2019.
Office Action for U.S. Appl. No. 15/774,221, notified Apr. 12, 2019.
Restriction Requirement for U.S. Appl. No. 15/774,221, notified on Feb. 6, 2019.
Search Report for Taiwan Patent Application No. 105133413, dated Apr. 16, 2020.
Search Report for Taiwan Patent Application No. 105134427, dated Jan. 14, 2020.
English Translation of Office Action for Chinese Patent Application No. 201580085212.7, dated Mar. 1, 2022.

* cited by examiner

HYBRID MICROELECTRONIC SUBSTRATE AND METHODS FOR FABRICATING THE SAME

CLAIM OF PRIORITY

This Applications is a Divisional of U.S. patent application Ser. No. 15/774,221, filed May 7, 2018 and titled HYBRID MICROELECTRONIC SUBSTRATE AND METHODS FOR FABRICATING THE SAME, which is a National Stage Entry of, and claims priority to, PCT Application No. PCT/US15/64722, filed on Dec. 9, 2015, and entitled "HYBRID MICROELECTRONIC SUBSTRATE AND METHODS FOR FABRICATING THE SAME", which is incorporated by reference in its entirety for all purposes.

TECHNICAL FIELD

Embodiments of the present description generally relate to the field of microelectronic substrates, and, more particularly, to the fabricating a hybrid microelectronic substrate comprising an embedded high density microelectronic patch substrate within a lower density microelectronic substrate.

BACKGROUND

The microelectronic industry is continually striving to produce ever faster and smaller microelectronic devices for use in various electronic products, including, but not limited to portable products, such as portable computers, digital cameras, electronic tablets, cellular phones, wearable electronics, applications for the Internet of Things, and the like. As the size of the microelectronic devices is reduced, it becomes more difficult to attach these microelectronic devices to microelectronic substrates in order to form electrical interconnections between various components.

One solution for the attachment issue would be to fabricate the microelectronic substrate entirely with high density electrical routing, as will be understood to those skilled in the art. However, such high density electrical routing requires expensive lithography processes, which can cost between 10 times to 50 times more than standard lithography processes used for fabricating lower density substrates, such as printed circuit boards. Another solution would be to fabricate an interposer, such as a silicon interposer, to position between the microelectronic device and the microelectronic substrate. Such interposers can be used to connect the microelectronic device to the microelectronic substrate by providing electrical routes that are high density in the area of the microelectronic device and which spread or fan out through the interposer to a lower density at the microelectronic substrate. However, such interposers can reduce electrical performance and may increase the height or thickness of the resulting microelectronic structure. Therefore, there in a need to develop microelectronic substrates which can economically provide both high density and low density interconnections.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The present disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer or component with respect to other layers or components. One layer/component "over" or "on" another layer/component or bonded "to" another layer/component may be directly in contact with the other layer/component or may have one or more intervening layers/components. One layer/component "between" layers/components may be directly in contact with the layers/components or may have one or more intervening layers/components.

Embodiments of the present description include the incorporation of a high density microelectronic patch substrate within a lower density microelectronic substrate to form a hybrid microelectronic substrate. Such hybrid microelectronic substrates may allow for direct flip chip attachment of a microelectronic device having high density interconnections to the high density microelectronic patch substrate portion of the hybrid microelectronic substrate, while allowing for lower density interconnections and electrical routes in areas where high density interconnections are not required. In one embodiment, the high density patch substrate may be embedded in the lower density microelectronic substrate during a build-up process used to form the hybrid microelectronic substrate.

As defined for purposes of the present description, the term "lower density" in "lower density microelectronic substrate" is relative to the term "high density" in "high density microelectronic patch substrate" in that the conductive routes (i.e. the conductive traces and the conductive vias) of the lower density microelectronic substrate are larger and have a greater pitch/spacing than the conductive routes (i.e. the conductive traces and the conductive vias) of the high density microelectronic patch substrate, and vice versa, as will be discussed. Further, it is understood that the term "patch substrate" refers to a microelectronic structure which merely routes power and signals for a microelectronic device and does not contain active or passive circuitry (i.e. transistors, diodes, resistors, inductors, capacitors, and the like) beyond the conductive routes.

Figure 1:
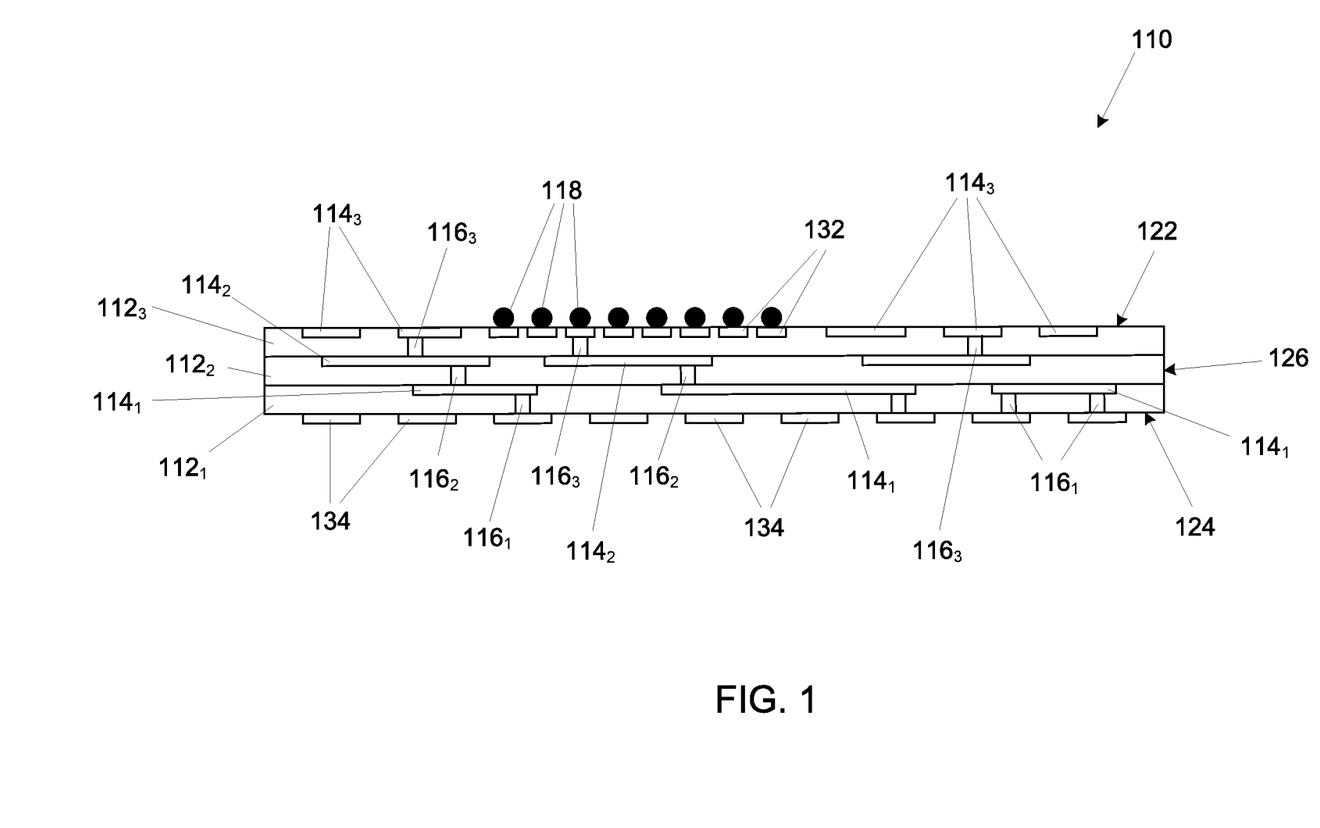
FIGS. 1-8 illustrate side cross sectional views of a method of forming a hybrid microelectronic substrate, according to an embodiment of the present description.

FIGS. 1-8 illustrate a method of fabricating a hybrid microelectronic substrate, according to embodiments of the present description. As shown in FIG. 1, a high density microelectronic patch substrate 110 may be formed comprising a plurality of dielectric material layers $112_1$-$112_3$ and a plurality of conductive routes, such as conductive traces $114_1$-$114_3$ formed in or on the dielectric material layers $112_1$-$112_3$, respectively, which are connected with conductive vias $116_1$-$116_3$. The high density microelectronic patch substrate 110 may further include a plurality of bond pads 132 in or on a first surface of 122 of the high density microelectronic patch substrate 110 and a plurality of bond pads 134 in or on a second surface 124 of the high density microelectronic patch substrate 110, wherein at least one conductive route extends between at least one of the plurality of bond pads 132 in or on a first surface of 122 of the high density microelectronic patch substrate 110 and at least one of the plurality of bond pads 134 in or on a second surface 124 of the high density microelectronic patch substrate 110. The high density microelectronic patch substrate 110 may further include at least one side 126 extending between the first surface 122 and the second surface 124 of the high density microelectronic patch substrate 110.

The conductive traces $114_1$-$114_3$ and the conductive vias $116_1$-$116_3$ may be made of any appropriate conductive material, including but not limited to, metals, such as copper, silver, nickel, gold, and aluminum, alloys thereof, and the like. The dielectric material layers $112_1$-$112_3$ may be any appropriate dielectric material, including but not limited to, bismaleimine triazine resin, fire retardant grade 4 material, polyimide materials, glass reinforced epoxy matrix material, polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, and the like.

As further shown in FIG. 1, a plurality of interconnect structures 118 may be formed on respective bond pads 132 in or on the first surface 122 of the high density microelectronic patch substrate 110. The interconnect structures 126 can be made of any appropriate material, including, but not limited to, solders materials. The solder materials may be any appropriate material, including but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys.

It is understood that although FIG. 1 illustrates a specific number of dielectric material layers and conductive routes, any appropriate number may be fabricated. The various methods for the fabrication of the dielectric material layers $112_1$-$112_3$, the conductive traces $114_1$-$114_3$, the conductive vias $116_1$-$116_3$, the bond pads 132/134, and the interconnect structures 118 are well known in the art, and for the sake of brevity and conciseness will not be described or illustrated herein.

Figure 2:
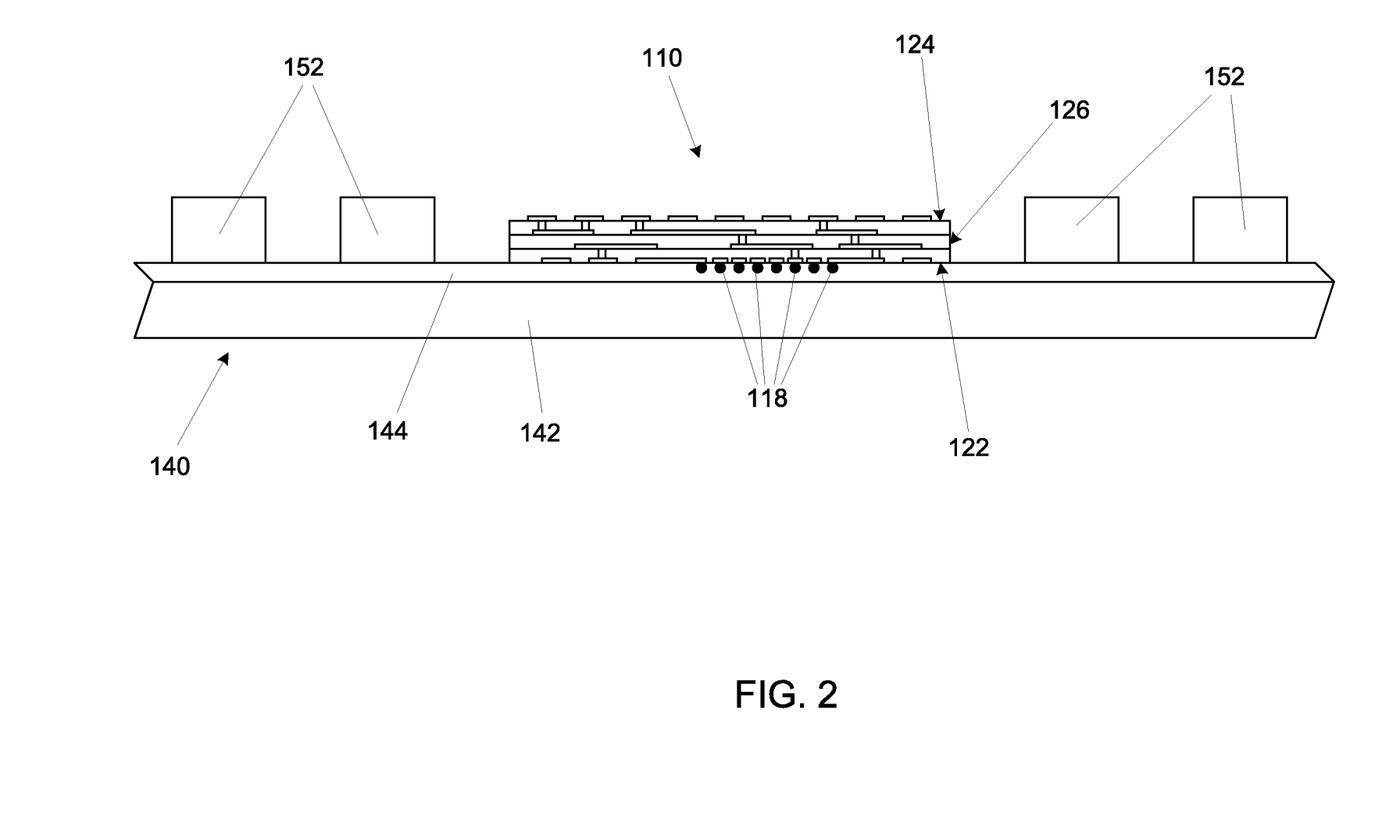

As illustrated in FIG. 2, the high density microelectronic patch substrate 110 may be aligned on a panel 140 with the first surface 122 of the high density microelectronic patch substrate 110 adjacent the panel 140. In one embodiment, as illustrated, the panel 140 may be a peelable core panel having a substantially rigid core 142 and a temporary adhesive layer 144 that may be in contact the first surface 122 of the high density microelectronic patch substrate 110. As further shown in FIG. 2, the interconnect structures 118 may extend into the temporary adhesive layer 144. The core 142 and the temporary adhesive layer 144 may be any appropriate materials known in the art.

As further illustrated in FIG. 2, a plurality of top contact pads 152 may be formed on the panel 140 (illustrated as being formed on the temporary adhesive layer 144). The top contact pads 152 may be formed by any known process and may be formed from any appropriate conductive material.

Figure 3:
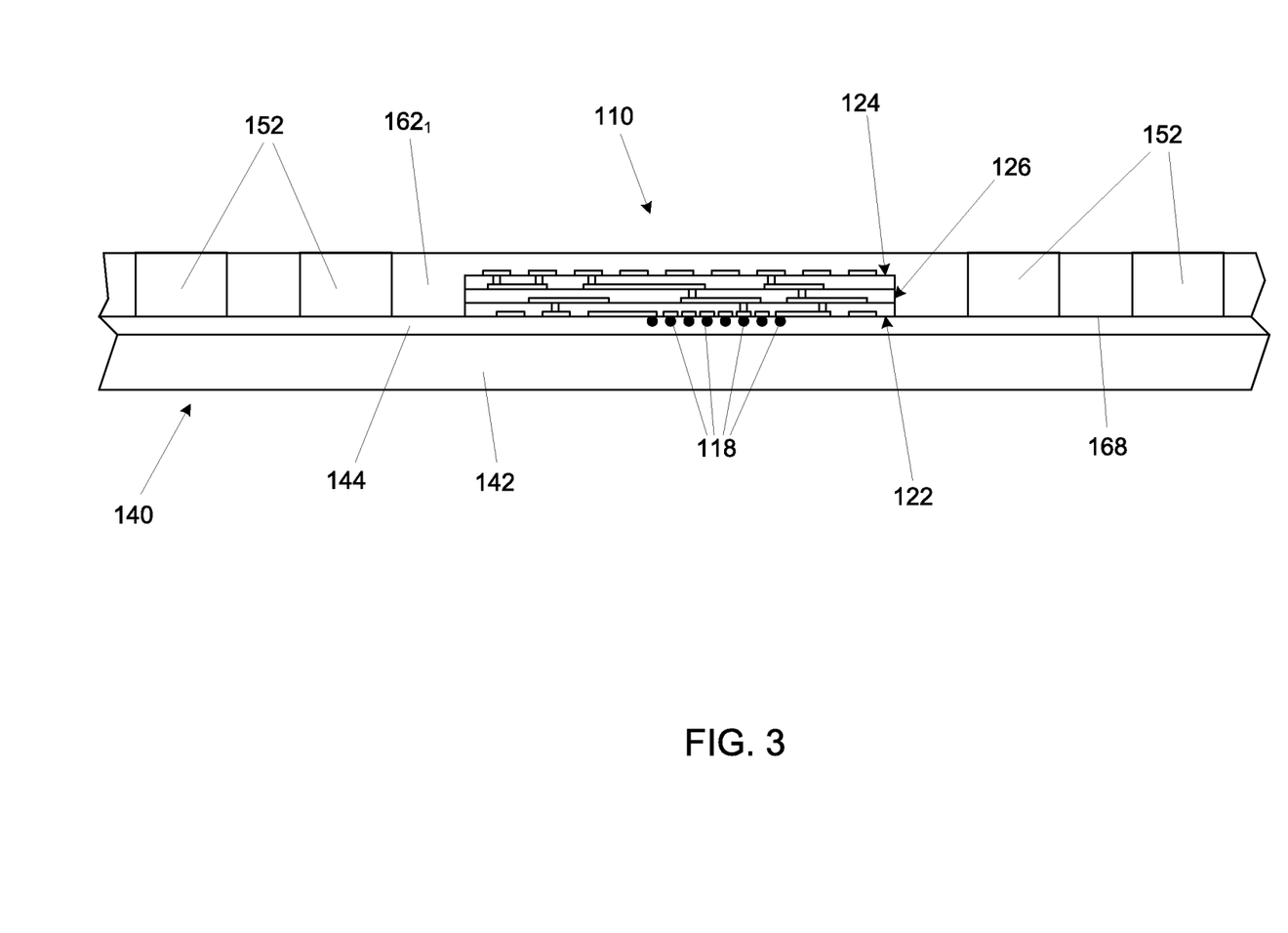

As illustrated in FIG. 3, the high density microelectronic patch substrate 110 may be encapsulated in a first dielectric material layer $162_1$, wherein the first dielectric material layer $162_1$ contacts the side(s) 126 and the second surface 124 of the high density microelectronic patch substrate 110. The first dielectric material layer $162_1$ may be formed from any appropriate dielectric material layer and may be formed by any appropriate method, including, but not limited to deposition and lamination. In one embodiment, the first dielectric material layer $162_1$ may be an epoxy-based dielectric material. As also shown in FIG. 3, the first dielectric material layer $162_1$ may also contact and/or encase the top contact pads 152. Furthermore, the surface of the first dielectric material layer $162_1$ contacting the panel 140 forms a first dielectric material layer outer surface 168.

Figure 4:
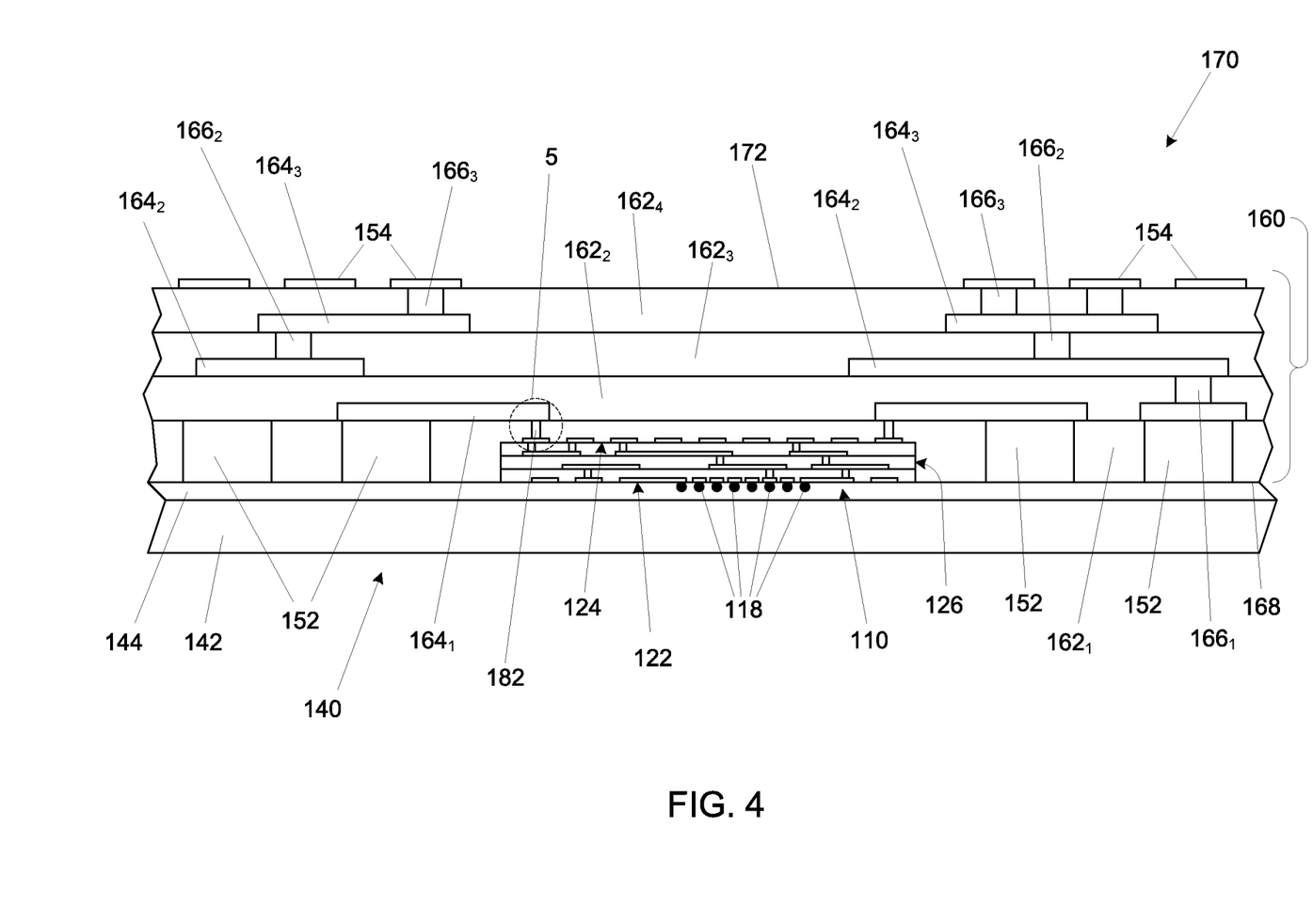

As shown in FIG. 4, a plurality of additional dielectric material layers $162_2$-$162_4$ and conductive routes, such as conductive traces $164_1$-$164_3$ connected with conductive vias $166_1$-$166_3$, may be formed on first dielectric material layer $162_1$, and a plurality of bottom contact pads 154 may be formed in or on an outer surface 172 of an uppermost dielectric material layer (i.e. additional dielectric material layer $162_4$), wherein the top contact pads 152 and the bottom contact pad 154 may be electrically connected to the conductive routes. The top contact pads 152, the first dielectric material layer $162_1$, the additional dielectric material layers $162_2$-$162_4$, the conductive traces $164_1$-$164_3$, the conductive vias $166_1$-$166_3$, and the bottom contact pads 154 may comprise a lower density microelectronic substrate 160. Thus, the combination of the high density microelectronic patch substrate 110 and the lower density microelectronic substrate 160 forms the hybrid microelectronic substrate 170.

It is understood that although FIG. 4 illustrates a specific number of dielectric material layer and conductive routes, any appropriate number may be fabricated. The various methods for the fabrication of the dielectric material layers $162_1$-$162_3$, the conductive traces $164_1$-$164_3$, the conductive vias $166_1$-$166_3$, the top contact pads 152, and the bottom contact pads 154 are well known in the art, and for the sake of brevity and conciseness will not be described or illustrated herein.

Again, the term "lower density microelectronic substrate" is relative to the term "high density microelectronic patch substrate" in that the conductive routes (i.e. the conductive traces $164_1$-$164_3$ and the conductive vias $166_1$-$166_3$) of the lower density microelectronic substrate 160 are larger and have a greater pitch/spacing than the conductive routes (i.e. the conductive traces $114_1$-$114_3$ and the conductive vias $116_1$-$116_3$) of the high density microelectronic patch substrate 110, and vice versa, as will be understood to those skilled in the art.

The conductive traces $164_1$-$164_3$ and the conductive vias $166_1$-$166_3$ may be made of any appropriate conductive material, including but not limited to, metals, such as copper, silver, nickel, gold, and aluminum, alloys thereof, and the like. The first dielectric material layer $162_1$ and the additional dielectric material layers $162_2$-$162_4$ may be any appropriate dielectric material, including but not limited to, bismaleimine triazine resin, fire retardant grade 4 material, polyimide materials, glass reinforced epoxy matrix material, polyimide materials, and the like, as well as low-k and ultra low-k dielectrics (dielectric constants less than about 3.6), including but not limited to carbon doped dielectrics, fluorine doped dielectrics, porous dielectrics, organic polymeric dielectrics, and the like.

Figure 5:
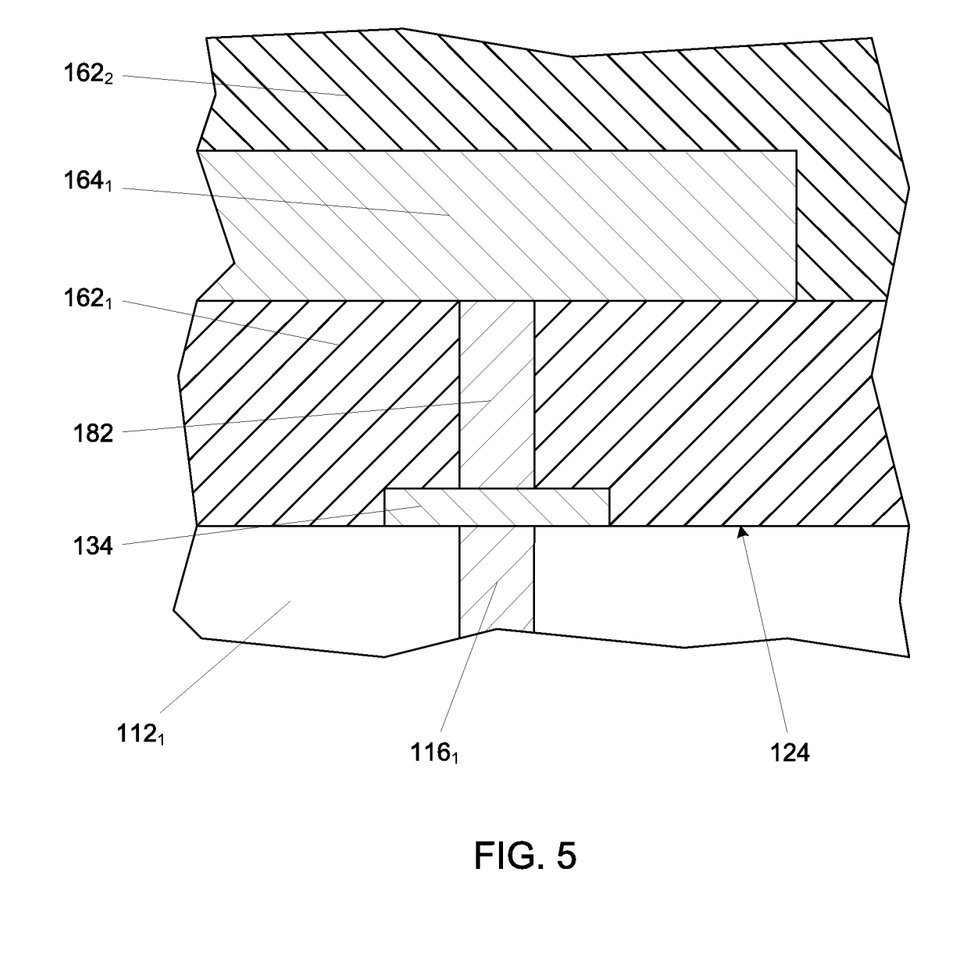

As shown in FIG. 4 and as further shown in FIG. 5 (an enlargement of area 5 of FIG. 4), at least one conductive route (shown as conductive trace $164_1$) of the lower density microelectronic substrate 160 may be in electrical contact with at least one of the plurality of bond pads 134 in or on a second surface 124 of the high density microelectronic patch substrate 110 through at least one electrical contact, such as at least one conductive microvia 182. In one embodiment, the conductive microvias 182 may be formed by forming small vias with a laser through a portion of the first dielectric material layer $162_1$ to expose at least one of the plurality of bond pads 134 in or on the second surface 124 of the high density microelectronic patch 110, then filling the vias with a conductive material, as known in art, prior to the formation of the plurality of additional dielectric material layers $162_2$-$162_4$ and the conductive routes (i.e. the conductive traces $164_1$-$164_3$ and the conductive vias $166_1$-$166_3$). The various specific methods for the fabrication of the conductive microvias 182 are well known in the art and, for the sake of brevity and conciseness, will not be described or illustrated herein.

Figure 6:
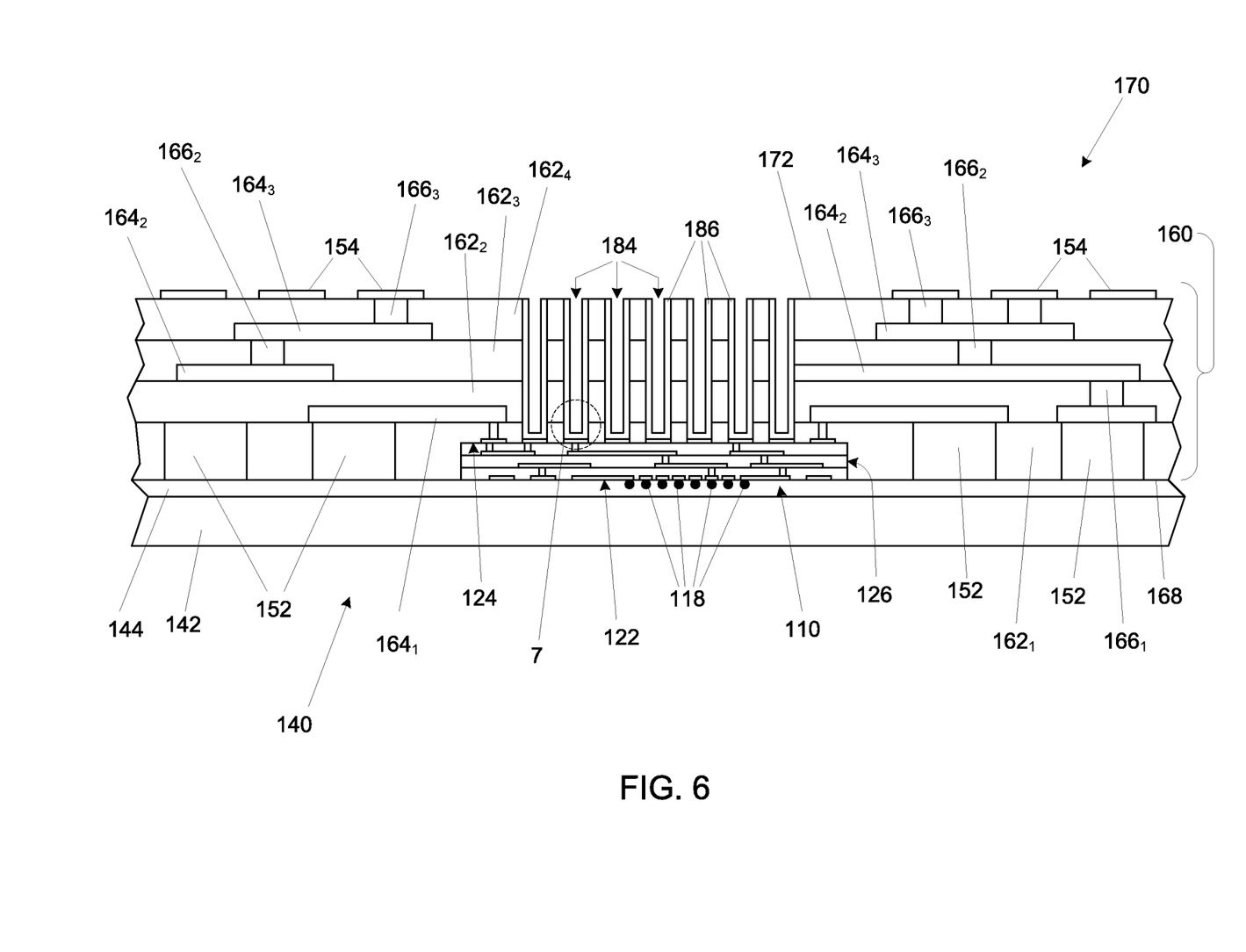
Figure 7:
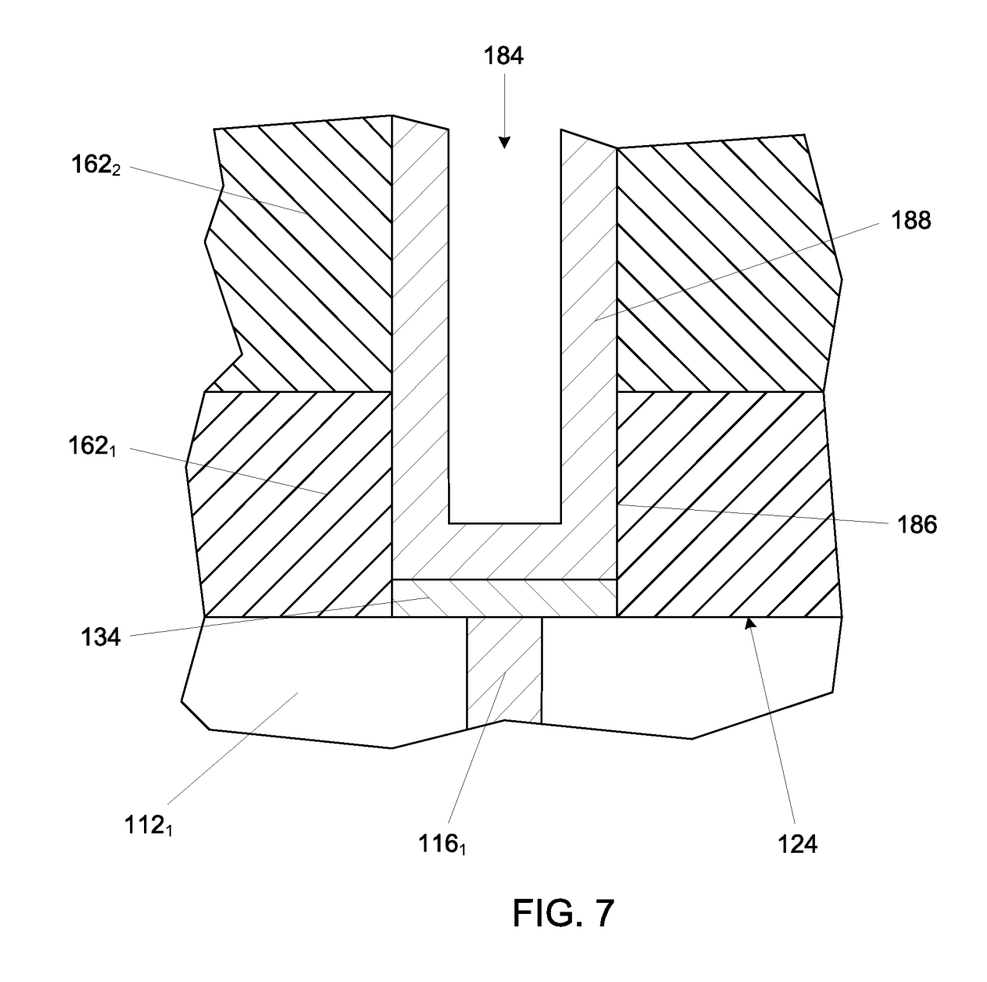

As shown in FIGS. 6 and 7 (an enlargement of area 7 of FIG. 6), at least one conductive route (shown as conductive trace $164_2$) of the lower density microelectronic substrate 160 may be in electrical contact with at least one of the plurality of bond pads 134 in or on a second surface 124 of the high density microelectronic patch substrate 110 through at least one electrical contact, such as at least one conductive blind via 184, which extends from the outer surface 172 of the uppermost dielectric material layer (i.e. additional dielectric material layer $162_4$) to at least one of the plurality of bond pads 134 in or on a second surface 124 of the high density microelectronic patch substrate 110. In one embodiment, the conductive blind vias 184 may be formed by forming vias 186 with a laser or by mechanical drilling through the additional dielectric material layers $162_2$-$162_4$ and through a portion of the first dielectric material layer $162_1$ to expose at least one of the plurality of bond pads 134 in or on the second surface 124 of the high density microelectronic patch substrate 110 followed by plating a conductive material 188 therein, as known in the art, wherein the conductive material 188 contacts at least one conductive route (shown as conductive trace $164_2$) of the lower density microelectronic substrate 160. The various specific methods for the fabrication of the conductive blind vias 184 are well known in the art and, for the sake of brevity and conciseness, will not be described or illustrated herein.

Figure 8:
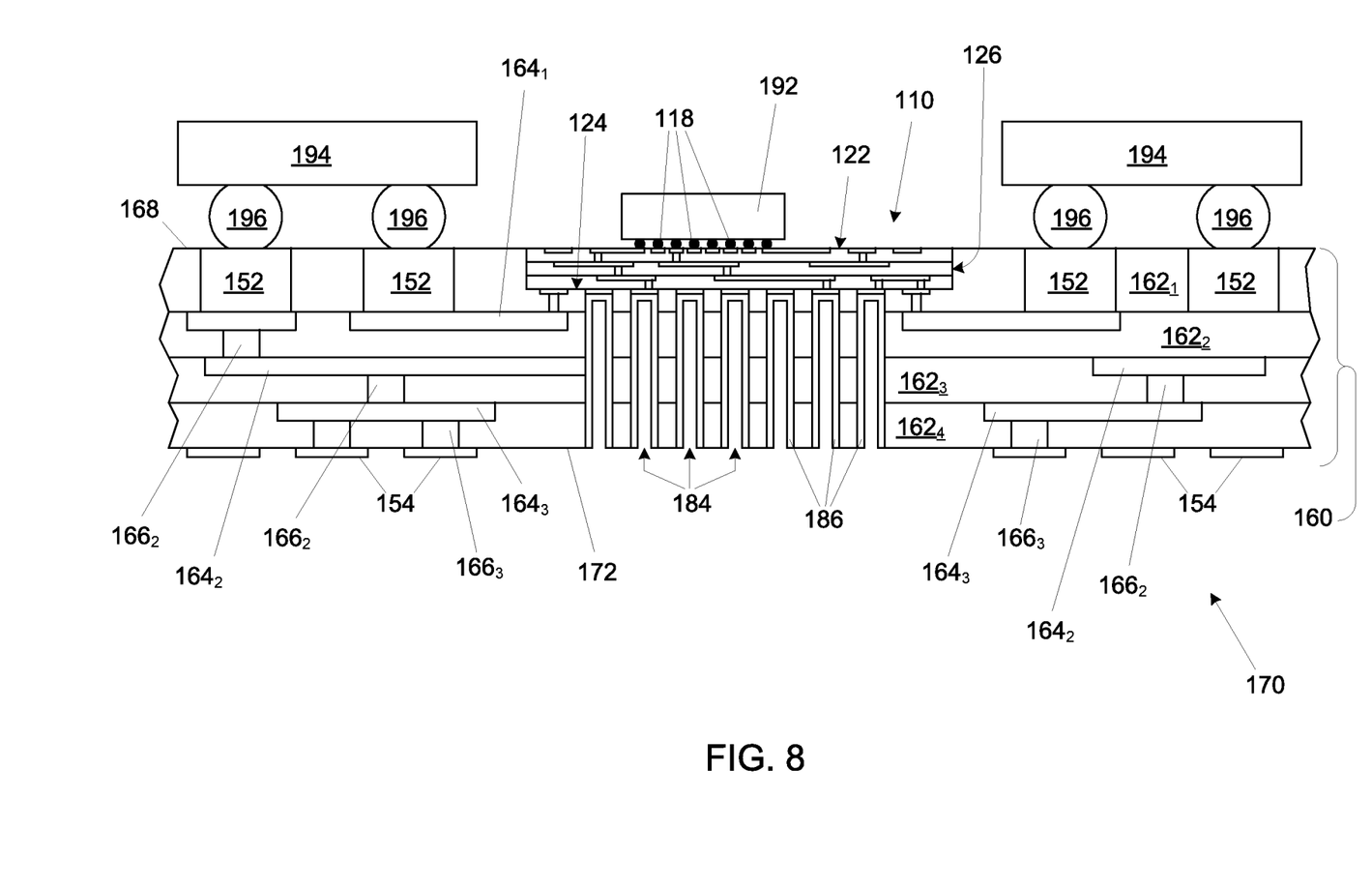

As shown in FIG. 8, the hybrid microelectronic substrate 170 may be removed from the panel 140. At least one microelectronic device 192 may be electrically attached to the high density microelectronic patch substrate 110, such as with at least one of the plurality of interconnect structures 118. At least one additional microelectronic device 194 may be attached to at least one of the plurality of top contact pads 152, such as with at least one solder ball 196. The at least one microelectronic device 192 and the at least one additional microelectronic device 194 may be any appropriate device, including, but not limited to a microprocessor, a chipset, a graphics device, a wireless device, a memory device, an application specific integrated circuit, or the like.

In one embodiment, the first dielectric material layer $162_1$ may be a different dielectric material from the additional dielectric material layers $162_2$-$162_4$ in order for the first dielectric material layer $162_1$ to most easily encapsulate and retain the high density microelectronic patch substrate 110. In a further embodiment, the plurality of dielectric material layers $112_1$-$112_3$ of the high density microelectronic patch substrate 110 may be a different dielectric material from the first dielectric material layer $162_1$ and the additional dielectric material layers $162_2$-$162_4$ of the lower density microelectronic substrate 160. In still a further embodiment, the first surface 122 of the high density microelectronic patch substrate 110 may be in substantially the same plane as the first dielectric material layer outer surface 168.

Figure 9:
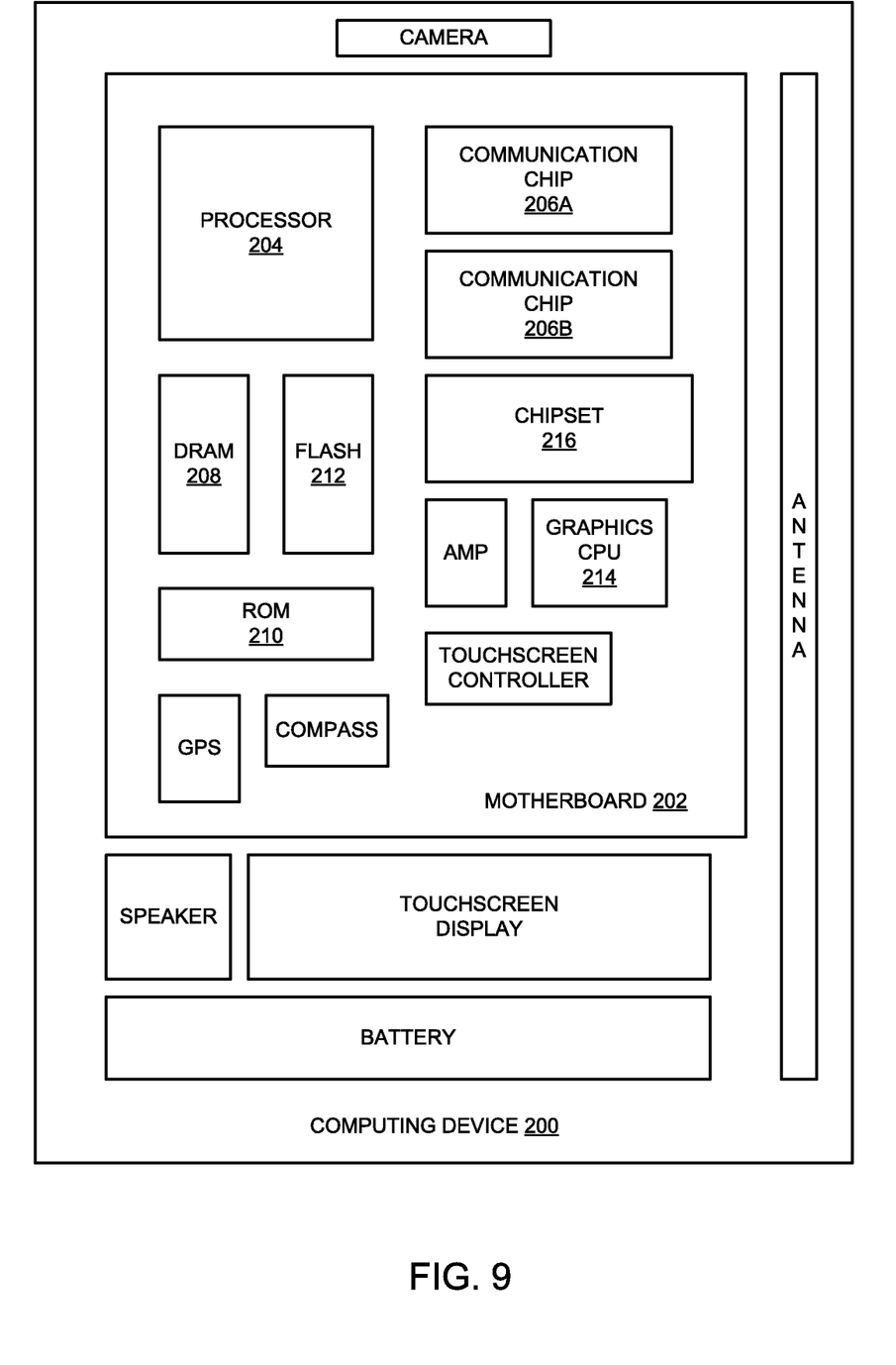
FIG. 9 illustrates a computing device in accordance with one implementation of the present description.

FIG. 9 illustrates a computing device 200 in accordance with one implementation of the present description. The computing device 200 houses a board 202. The board may include a number of microelectronic components, including but not limited to a processor 204, at least one communication chip 206A, 206B, volatile memory 208, (e.g., DRAM), non-volatile memory 210 (e.g., ROM), flash memory 212, a graphics processor or CPU 214, a digital signal processor (not shown), a crypto processor (not shown), a chipset 216, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 202. In some implementations, at least one of the microelectronic components may be a part of the processor 204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 200 may include the hybrid substrate 170, as described in the present description.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-9. The subject matter may be applied to other microelectronic structure and assembly applications, as will be understood to those skilled in the art.

The following examples pertain to further embodiments, wherein Example 1 is a hybrid microelectronic substrate, comprising a high density microelectronic patch substrate having a first surface, an opposing second surface, and at least one side; and a lower density microelectronic substrate, wherein the high density patch substrate is embedded within a first dielectric layer of the lower density microelectronic substrate, wherein a first dielectric material layer of the lower density microelectronic substrate abuts the second surface and the at least one side of the high density microelectronic patch substrate, and wherein at least one of a plurality of conductive routes within the lower density microelectronic substrate is in electrical contact with at least one of a plurality conductive routes within the high density microelectronic patch substrate at the high density microelectronic patch substrate second surface.

In Example 2, the subject matter of Example 1 can optionally include at least one of the plurality of conductive routes within the lower density microelectronic substrate being in electrical contact with at least one of a plurality conductive routes within the high density microelectronic patch substrate through a microvia extending through a portion the first dielectric material layer.

In Example 3, the subject matter of Example 1 can optionally include the lower density microelectronic substrate including a plurality of additional dielectric material layers formed on the first dielectric material layer.

In Example 4, the subject matter of Example 3 can optionally include the plurality of additional dielectric material layers of the lower density microelectronic substrate comprises a different dielectric material from the first dielectric material layer of the lower density microelectronic substrate.

In Example 5, the subject matter of Example 3 can optionally include at least one of the plurality of conductive routes within the lower density microelectronic substrate being in electrical contact with at least one of the plurality conductive routes within the high density microelectronic patch substrate through a conductive blind via extending through the plurality of additional dielectric material layers and through a portion of first dielectric material layer.

In Example 6, the subject matter of any of Example 3 to 5, wherein the lower density microelectronic substrate includes at least one bottom contact pad formed in or on an outer surface of an uppermost dielectric material layer of the plurality of additional dielectric material layers.

In Example 7, the subject matter of any of Examples 1 to 5 can optionally include the high density microelectronic patch substrate further including a plurality of bond pads in or on the first surface of the high density microelectronic patch substrate and a plurality of bond pads in or on the second surface of the high density microelectronic patch substrate; and, wherein at least one of the plurality conductive routes within the high density microelectronic patch substrate extends between one of the plurality of bond pads in or on the first surface of the high density microelectronic patch substrate and one of the plurality of bond pads in or on the second surface of the high density microelectronic patch substrate.

In Example 8, the subject matter of any of Examples 1 to 5 can optionally include the high density microelectronic patch substrate further including a plurality of dielectric material layers, wherein the lower density microelectronic substrate includes a plurality of additional dielectric material layers formed on the first dielectric material layer, and wherein the plurality of dielectric material layers of the high density microelectronic patch substrate is a different dielectric material from the first dielectric material layer and the additional dielectric material layers of the lower density microelectronic substrate.

In Example 9, the subject matter of any of Examples 3 to 5 can optionally include the lower density microelectronic substrate including at least one top contact pad formed in the first dielectric material layer, wherein the at least one top contact pad is electrical contact with at least one of the plurality of conductive routes within the lower density microelectronic substrate.

The following examples pertain to further embodiments, wherein Example 10 is a method of forming a hybrid microelectronic substrate, comprising forming a high density microelectronic patch substrate having a first surface, an opposing second surface, and at least one side; aligning the first surface of the high density microelectronic patch substrate on a panel; disposing a first dielectric material layer over the high density microelectronic patch substrate, wherein the first dielectric material layer abuts the second surface and the at least one side of the high density microelectronic patch substrate; forming at least one additional dielectric material layer over the first dielectric material layer; forming at least one conductive route within the first dielectric material layer and the at least one additional dielectric material layer, wherein the first dielectric material, the at least one additional dielectric material layer, and the at least one conductive route within the first dielectric layer and the at least one addition dielectric material comprise a lower density microelectronic substrate; and forming at least one electrical contact through a portion of the first dielectric material layer to electrical connect the at least one conductive route of the lower density microelectronic substrate to the high density microelectronic patch substrate.

In Example 11, the subject matter of Example 10 can optionally include forming at least one electrical contact through a portion of the first dielectric material layer to electrical connect the at least one conductive route of the lower density microelectronic substrate to the high density microelectronic patch substrate comprising forming at least one conductive microvia through a portion of the first dielectric material layer prior to forming the at least one additional dielectric material layer.

In Example 12, the subject matter of Example 11 can optionally include forming the at least one conductive microvia through a portion of the first dielectric material layer comprises forming at least one via with a laser and filling the at least one via with a conductive material.

In Example 13, the subject matter of Example 10 can optionally include forming the at least one electrical contact through a portion of the first dielectric material layer to electrical connect the at least one conductive route of the lower density microelectronic substrate to the high density microelectronic patch substrate comprising forming a conductive blind via through the at least one additional dielectric material layer and through a portion of the first dielectric material.

In Example 14, the subject matter of Example 13 can optionally include forming the conductive blind via through the at least one additional dielectric material layer and through a portion of the first dielectric material comprising forming a via through the at least one additional dielectric material layer and through a portion of the first dielectric material and plating a conductive material in the via.

In Example 15, the subject matter of Example 10 can optionally include forming the at least one additional dielectric material layer over the first dielectric material layer comprising forming at least one additional dielectric material layer over the first dielectric material layer, wherein the at least one additional dielectric material layer is a different dielectric material from the first dielectric material layer.

In Example 16, the subject matter of any of Examples 10 to 15 can optionally include forming the high density microelectronic patch substrate further including forming a plurality of bond pads in or on the first surface of the high density microelectronic patch substrate and forming a plurality of bond pads in or on the second surface of the high density microelectronic patch substrate; and, wherein at least one of the plurality conductive routes within the high density microelectronic patch substrate extends between one of the plurality of bond pads in or on the first surface of the high density microelectronic patch substrate and one of the plurality of bond pads in or on the second surface of the high density microelectronic patch substrate.

In Example 17, the subject matter of any of Examples 10 to 15 can optionally include forming the high density microelectronic patch substrate further including forming a plurality of dielectric material layers, and wherein the plurality of dielectric material layers of the high density microelectronic patch substrate is a different dielectric material from the first dielectric material layer and the additional dielectric material layers of the lower density microelectronic substrate.

In Example 18, the subject matter of any of Examples 10 to 15 can optionally include forming at least one top contact pad on the panel, wherein disposing a first dielectric material layer over the high density microelectronic patch substrate encases the at least one top contact pad, and wherein the at least one top contact pad is electrical contact with at least one of the plurality of conductive routes within the lower density microelectronic substrate.

In Example 19, the subject matter of any of Examples 10 to 15 can optionally include the lower density microelectronic substrate includes at least one bottom contact pad formed in or on an outer surface of an uppermost dielectric material layer of the at least one additional dielectric material layer, and wherein the at least one top contact pad is electrical contact with at least one of the plurality of conductive routes within the lower density microelectronic substrate.

The following examples pertain to further embodiments, wherein Example 20 is an electronic system, comprising a board; and a microelectronic component attached to the board, wherein at least one of the microelectronic component and the board, includes a hybrid microelectronic substrate, comprising a high density microelectronic patch substrate having a first surface, an opposing second surface, and at least one side; and a lower density microelectronic substrate, wherein the high density patch substrate is embedded within a first dielectric layer of the lower density microelectronic substrate, wherein a first dielectric material layer of the lower density microelectronic substrate abuts the second surface and the at least one side of the high density microelectronic patch substrate, and wherein at least one of a plurality of conductive routes within the lower density microelectronic substrate is in electrical contact with at least one of a plurality conductive routes within the high density microelectronic patch substrate at the high density microelectronic patch substrate second surface.

In Example 21, the subject matter of Example 20 can optionally include at least one of the plurality of conductive routes within the lower density microelectronic substrate being in electrical contact with at least one of a plurality conductive routes within the high density microelectronic patch substrate through a microvia extending through a portion the first dielectric material layer.

In Example 22, the subject matter of Example 20 can optionally include the lower density microelectronic substrate including a plurality of additional dielectric material layers formed on the first dielectric material layer.

In Example 23, the subject matter of Example 22 can optionally include the plurality of additional dielectric material layers of the lower density microelectronic substrate comprises a different dielectric material from the first dielectric material layer of the lower density microelectronic substrate.

In Example 24, the subject matter of Example 22 can optionally include at least one of the plurality of conductive routes within the lower density microelectronic substrate being in electrical contact with at least one of the plurality conductive routes within the high density microelectronic patch substrate through a conductive blind via extending through the plurality of additional dielectric material layers and through a portion of first dielectric material layer.

In Example 25, the subject matter of any of Examples 20 to 24, wherein the lower density microelectronic substrate includes at least one bottom contact pad formed in or on an outer surface of an uppermost dielectric material layer of the plurality of additional dielectric material layers.

In Example 26, the subject matter of any of Examples 20 to 24 can optionally include the high density microelectronic patch substrate further including a plurality of bond pads in or on the first surface of the high density microelectronic patch substrate and a plurality of bond pads in or on the second surface of the high density microelectronic patch substrate; and, wherein at least one of the plurality conductive routes within the high density microelectronic patch substrate extends between one of the plurality of bond pads in or on the first surface of the high density microelectronic patch substrate and one of the plurality of bond pads in or on the second surface of the high density microelectronic patch substrate.

In Example 27, the subject matter of any of Examples 20 to 24 can optionally include the high density microelectronic patch substrate further including a plurality of dielectric material layers, wherein the lower density microelectronic substrate includes a plurality of additional dielectric material layers formed on the first dielectric material layer, and wherein the plurality of dielectric material layers of the high density microelectronic patch substrate is a different dielectric material from the first dielectric material layer and the additional dielectric material layers of the lower density microelectronic substrate.

In Example 28, the subject matter of any of Examples 22 to 24 can optionally include the lower density microelectronic substrate including at least one top contact pad formed in the first dielectric material layer, wherein the at least one top contact pad is electrical contact with at least one of the plurality of conductive routes within the lower density microelectronic substrate.

Having thus described in detail embodiments of the present description, it is understood that the present description defined by the appended claims is not to be limited by particular details set forth in the above description, as many apparent variations thereof are possible without departing from the spirit or scope thereof

What is claimed is:

1. A method of forming a hybrid microelectronic substrate, comprising:
    forming a high density microelectronic patch substrate having a first surface, an opposing second surface, and at least one side, wherein the high density microelectronic patch substrate comprises a plurality of dielectric layers and a plurality of conductive routes;
    aligning the first surface of the high density microelectronic patch substrate on a panel;
    disposing a first dielectric material layer over the high density microelectronic patch substrate, wherein the first dielectric material layer contacts at least one dielectric layer of the plurality of dielectric layer of the high density microelectronic patch substrate at the second surface thereof and contacts the at least one side of the high density microelectronic patch substrate;
    forming at least one additional dielectric material layer over the first dielectric material layer;
    forming at least one conductive route within the first dielectric material layer and the at least one additional dielectric material layer, wherein the first dielectric material, the at least one additional dielectric material layer, and the at least one conductive route within the first dielectric layer and the at least one addition dielectric material comprise a lower density microelectronic substrate and wherein the lower density microelectronic substrate includes at least one contact pad formed in or on an outer surface of an uppermost dielectric material layer of the at least one additional dielectric material layer, and wherein the at least one top contact pad is in electrical contact with at least one conductive route of the plurality of conductive routes within the lower density microelectronic substrate; and
    forming at least one electrical contact through a portion of the first dielectric material layer to electrical connect the at least one conductive route of the lower density microelectronic substrate to the high density microelectronic patch substrate.

2. The method of claim 1, wherein forming at least one electrical contact through a portion of the first dielectric material layer to electrical connect the at least one conductive route of the lower density microelectronic substrate to the high density microelectronic patch substrate comprises forming at least one conductive microvia through a portion of the first dielectric material layer prior to forming the at least one additional dielectric material layer.

3. The method of claim 2, wherein forming the at least one conductive microvia through a portion of the first dielectric material layer comprises forming at least one via with a laser and filling the at least one via with a conductive material.

4. The method of claim 1, wherein forming at least one electrical contact through a portion of the first dielectric material layer to electrical connect the at least one conductive route of the lower density microelectronic substrate to the high density microelectronic patch substrate comprises forming a conductive blind via through the at least one additional dielectric material layer and through a portion of the first dielectric material.

5. The method of claim 4, wherein forming a conductive blind via through the at least one additional dielectric material layer and through a portion of the first dielectric material comprises forming a via through the at least one additional dielectric material layer and through a portion of the first dielectric material and plating a conductive material in the via.

6. The method of claim 1, wherein forming at least one additional dielectric material layer over the first dielectric material layer comprises forming at least one additional dielectric material layer over the first dielectric material layer, wherein the at least one additional dielectric material layer is a different dielectric material from the first dielectric material layer.

7. The method of claim 1, wherein forming the high density microelectronic patch substrate further includes forming a plurality of bond pads in or on the first surface of the high density microelectronic patch substrate and forming a plurality of bond pads in or on the second surface of the high density microelectronic patch substrate; and, wherein at least one conductive route of the plurality of conductive routes within the high density microelectronic patch substrate extends between one of the plurality of bond pads in or on the first surface of the high density microelectronic patch substrate and one of the plurality of bond pads in or on the second surface of the high density microelectronic patch substrate.

8. The method of claim 1, wherein the plurality of dielectric material layers of the high density microelectronic patch substrate is a different dielectric material from the first dielectric material layer and the additional dielectric material layers of the lower density microelectronic substrate.

9. The method of claim 1, further including forming at least one top contact pad on the panel, wherein disposing the first dielectric material layer over the high density microelectronic patch substrate encases the at least one top contact pad, and wherein the at least one top contact pad is in electrical contact with at least one conductive route of the plurality of conductive routes within the lower density microelectronic substrate.

10. The method of claim 1, wherein the plurality of conductive routes of the high density microelectronic patch substrate comprise a plurality of conductive traces formed in or on each dielectric material layer of the plurality of dielectric layers, and wherein the conductive traces are connected with a plurality of conductive vias extending through each dielectric layer of the plurality of dielectric layers.

11. An electronic system, comprising:
a board; and
a microelectronic component attached to the board, wherein at least one of the microelectronic component and the board, includes a hybrid microelectronic substrate, comprising:
a high density microelectronic patch substrate having a first surface, an opposing second surface, and at least one side, wherein the high density microelectronic patch substrate comprises a plurality of dielectric layers and a plurality of conductive routes; and
a lower density microelectronic substrate, wherein the high density patch substrate is embedded within a first dielectric layer of the lower density microelectronic substrate, wherein a first dielectric material layer of the lower density microelectronic substrate contacts at least one dielectric layer of the plurality of dielectric layers of the high density microelectronic patch substrate at the second surface thereof and contacts the at least one side of the high density microelectronic patch substrate, wherein at least one conductive route of a plurality of conductive routes within the lower density microelectronic substrate is in electrical contact with at least one conductive route of the plurality of conductive routes within the high density microelectronic patch substrate at the high density microelectronic patch substrate second surface, wherein the lower density microelectronic substrate includes at least one top contact pad formed in the first dielectric material layer, and wherein the at least one top contact pad is in electrical contact with at least one conductive route of the plurality of conductive routes within the lower density microelectronic substrate.

12. The electronic system of claim 11, wherein at least one conductive route of the plurality of conductive routes within the lower density microelectronic substrate is in electrical contact with at least one conductive route of a plurality of conductive routes within the high density microelectronic patch substrate through a microvia extending through a portion the first dielectric material layer.

13. The electronic system of claim 11, wherein the lower density microelectronic substrate includes a plurality of additional dielectric material layers formed on the first dielectric material layer.

14. The electronic system of claim 13, wherein the plurality of additional dielectric material layers of the lower density microelectronic substrate comprises a different dielectric material from the first dielectric material layer of the lower density microelectronic substrate.

15. The electronic system of claim 13, wherein at least one conductive route of the plurality of conductive routes within the lower density microelectronic substrate is in electrical contact with at least one conductive route of the plurality of conductive routes within the high density microelectronic patch substrate through a conductive blind via extending through the plurality of additional dielectric material layers and through a portion of first dielectric material layer.

16. The electronic system of claim 13, wherein the lower density microelectronic substrate includes at least one contact pad formed in or on an outer surface of an uppermost dielectric material layer of the plurality of additional dielectric material layers.

17. The electronic system of claim 11, wherein the high density microelectronic patch substrate further includes a plurality of bond pads in or on the first surface of the high density microelectronic patch substrate and a plurality of bond pads in or on the second surface of the high density microelectronic patch substrate; and, wherein at least one conductive route of the plurality of conductive routes within the high density microelectronic patch substrate extends between one of the plurality of bond pads in or on the first surface of the high density microelectronic patch substrate and one of the plurality of bond pads in or on the second surface of the high density microelectronic patch substrate.

18. The electronic system of claim 11, wherein the lower density microelectronic substrate includes a plurality of additional dielectric material layers formed on the first dielectric material layer, and wherein the plurality of dielectric material layers of the high density microelectronic patch substrate is a different dielectric material from the first dielectric material layer and the additional dielectric material layers of the lower density microelectronic substrate.

19. The electronic system of claim 11, wherein the plurality of conductive routes of the high density microelectronic patch substrate comprise a plurality of conductive traces formed in or on each dielectric material layer of the plurality of dielectric layers, and wherein the conductive traces are connected with a plurality of conductive vias extending through each dielectric layer of the plurality of dielectric layers.

* * * * *